US007776763B2

(12) United States Patent
Reid et al.

(10) Patent No.: US 7,776,763 B2
(45) Date of Patent: Aug. 17, 2010

(54) IN-SITU FORMATION OF OXIDIZED ALUMINUM NITRIDE FILMS

(75) Inventors: Kimberly G. Reid, Austin, TX (US); Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 600 days.

(21) Appl. No.: 11/745,278

(22) Filed: May 7, 2007

(65) Prior Publication Data

US 2007/0259534 A1 Nov. 8, 2007

Related U.S. Application Data

(60) Provisional application No. 60/746,750, filed on May 8, 2006.

(51) Int. Cl.
*H01L 21/31* (2006.01)
*H01L 21/469* (2006.01)
(52) U.S. Cl. ........................................ 438/778; 438/783
(58) Field of Classification Search .................. 438/778, 438/783
See application file for complete search history.

(56) References Cited

U.S. PATENT DOCUMENTS

| 6,900,455 B2 | 5/2005 | Drewes |
| 2005/0136618 A1 | 6/2005 | Lee et al. |

FOREIGN PATENT DOCUMENTS

| JP | 10050609 A | 2/1998 |

OTHER PUBLICATIONS

European Patent Office, International Search Report and Written Opinion received in corresponding PCT Patent Application No. PCT/US2007/068447, dated Oct. 29, 2007, 12 pages.

*Primary Examiner*—Thien F Tran
(74) *Attorney, Agent, or Firm*—Wood, Herron & Evans, LLP

(57) ABSTRACT

A method is provided for in-situ formation of a thin oxidized AlN film on a substrate. The method includes providing the substrate in a process chamber, depositing an AlN film on the substrate, and post-treating the AlN film with exposure to a nitrogen and oxygen-containing gas. The post-treating increases the dielectric constant of the AlN film with substantially no increase in the AlN film thickness. The method can also include pre-treating the substrate prior to AlN deposition, post-annealing the AlN film before or after the post-treatment, or both.

17 Claims, 3 Drawing Sheets

IN-SITU FORMATION OF OXIDIZED ALUMINUM NITRIDE FILMS

CROSS-REFERENCE TO RELATED APPLICATION

The present invention claims benefit of and priority to U.S. Provisional Application No. 60/746,750, filed May 8, 2006, which is incorporated by reference herein in its entirety.

FIELD OF THE INVENTION

The present invention relates to formation of high dielectric constant films, and more particularly, to in-situ formation of oxidized aluminum nitride (AlN) films.

BACKGROUND OF THE INVENTION

Several methods have been developed for creating thin films on substrates used in manufacturing semiconductor devices. Among the more established techniques is Chemical Vapor Deposition (CVD). Atomic Layer Deposition (ALD), also referred to Molecular Layer Deposition (MLD), a variant of CVD, is a relatively newer technology now emerging as a potentially superior method of achieving uniform, conformal film deposition. ALD has demonstrated an outstanding ability to maintain ultra-uniform thin deposition layers over complex topology. This is at least partially true because ALD is not as flux dependent as is CVD. This flux-independent nature of ALD allows processing at lower temperatures than with conventional CVD methods.

The technique of ALD is based on the principle of the formation of a saturated monolayer of reactive precursor molecules by chemisorption. A typical ALD process for forming an AB film, for example, on a substrate consists of injecting a precursor or reactant A ($R_A$) for a period of time in which a saturated monolayer of A is formed on the substrate. Then, the precursor or reactant A ($R_A$) is purged from the chamber using an inert gas, GI. This is followed by injecting precursor or reactant B ($R_B$) into the chamber, also for a period of time, to combine B with A, thus forming the layer AB on the substrate. Then, the precursor or reactant B ($R_B$) is purged from the chamber. This process of introducing precursor or reactant A ($R_A$), purging the reactor, introducing precursor or reactant B ($R_B$), and purging the reactor can be repeated a number of times to achieve an AB film of a desired thickness.

In the semiconductor industry, the minimum feature sizes of microelectronic devices are well into the deep sub-micron regime to meet the demand for faster and lower power semiconductor devices. The downscaling of complimentary metal-oxide-semiconductor (CMOS) devices imposes scaling constraints on the gate dielectric material. The thickness of the conventional $SiO_2$ gate dielectric is approaching its physical limits. The most advanced devices are using nitrided $SiO_2$ gate dielectrics approaching equivalent oxide thickness (EOT) of about 1 nanometer (nm) or less where leakage current density can be as much as 1 $mA/cm^2$. To improve device reliability and reduce electrical leakage from the gate dielectric to the transistor channel during operation of the device, semiconductor transistor technology is planning on using high dielectric constant (high-k) gate dielectric materials that allow increased physical thickness of the gate dielectric layer while maintaining a low equivalent oxide thickness (EOT). Equivalent oxide thickness is defined as the thickness of $SiO_2$ that would produce the same capacitance as that obtained form an alternate dielectric material.

Dielectric materials featuring a dielectric constant greater than that of $SiO_2$ (k~3.9) are commonly referred to as high-k materials. High-k materials may refer to dielectric materials that are deposited onto substrates (e.g., $HfO_2$, $ZrO_2$, HfSiO, ZrSiO, etc.) rather than grown on the surface of a substrate, as can be the case for $SiO_2$. High-k materials may incorporate a metal oxide layer or a metal silicate layer, e.g., $Ta_2O_5$ (k~26), $TiO_2$ (k~80), $ZrO_2$ (k~25), AlN, (k~9), $Al_2O_3$ (k~9), HfSiO (k~5-20), and $HfO_2$ (k~25).

These exemplary high-k materials, and nanolaminates thereof, can be used in many logic and memory devices where the scaling of $SiO_2$ is no longer practical. Films of high-k materials often need to be relatively thin, for example less than about 50 angstrom (A). This requires the films to have good physical properties such as smooth film interfaces and good film uniformity across the wafer. In addition, good electrical properties such as low film interface trap densities, high dielectric constant, low hysteresis and low leakage currents are required for integration into semiconductor devices.

SUMMARY OF THE INVENTION

A method is provided for in-situ formation of a thin oxidized aluminum nitride film on a substrate.

According to one embodiment of the invention, the method includes providing the substrate in a process chamber, depositing an AlN film on the substrate, and post-treating the AlN film with exposure to a nitrogen and oxygen-containing gas. The post-treating increases the dielectric constant of the aluminum nitride film with substantially no increase in the aluminum nitride film thickness. The method can also include pre-treating the substrate prior to AlN deposition, annealing the AlN film before or after post-treating, or both.

According to another embodiment of the invention, the method includes providing the substrate in a process chamber, depositing an AlN film on the substrate by alternately exposing the substrate to $NH_3$ and TMA (trimethylaluminum, $Al(CH_3)_3$) at a substrate temperature between 350° C. and 450° C., where the AlN film has a thickness between 10 and 30 angstrom, and post-treating the AlN film with exposure to NO gas at a substrate temperature between 550° C. and 650° C.

According to another embodiment of the invention, the method includes providing the substrate in a process chamber, depositing an AlN film on the substrate by alternately exposing the substrate to $NH_3$ and TMA at a substrate temperature between 300° C. and 350° C., where the AlN film has a thickness between 30 and 50 angstrom, and post-treating the AlN film with exposure to NO gas at a substrate temperature between 750° C. and 850° C.

DETAILED DESCRIPTION OF SEVERAL EMBODIMENTS OF THE INVENTION

Embodiments of the invention provide a method for forming high dielectric constant oxidized AlN films with good physical and electrical properties. AlN is a high-k dielectric material with a wide band gap. AlN has good thermal and chemical stability and may be utilized as a gate dielectric and/or a diffusion barrier in a gate electrode structure. AlN has a relatively high dielectric constant with reported values between 6 and 18.

According to one embodiment of the invention, a method is provided for processing a substrate by providing the substrate in a process chamber, depositing an AlN film on the substrate, and post-treating the AlN film with exposure to a nitrogen and oxygen-containing gas, where the post-treating increases the dielectric constant of the AlN film without substantially increasing the thickness of the AlN film. The post-treated AlN has smooth film interfaces, good film uniformity across a wafer, low film interface trap densities, high dielectric constant, low hysteresis and low leakage currents when integrated into semiconductor devices.

The properties of the oxidized AlN films were examined using variable angle spectral ellipsometer (VASE), transmission electron microscopy (TEM), X-ray photoelectron spectroscopy (XPS), atomic force microscopy (AFM), capacitance voltage (CV) testing, and stepped voltage testing for leakage current measurements (IV).

Figure 1:
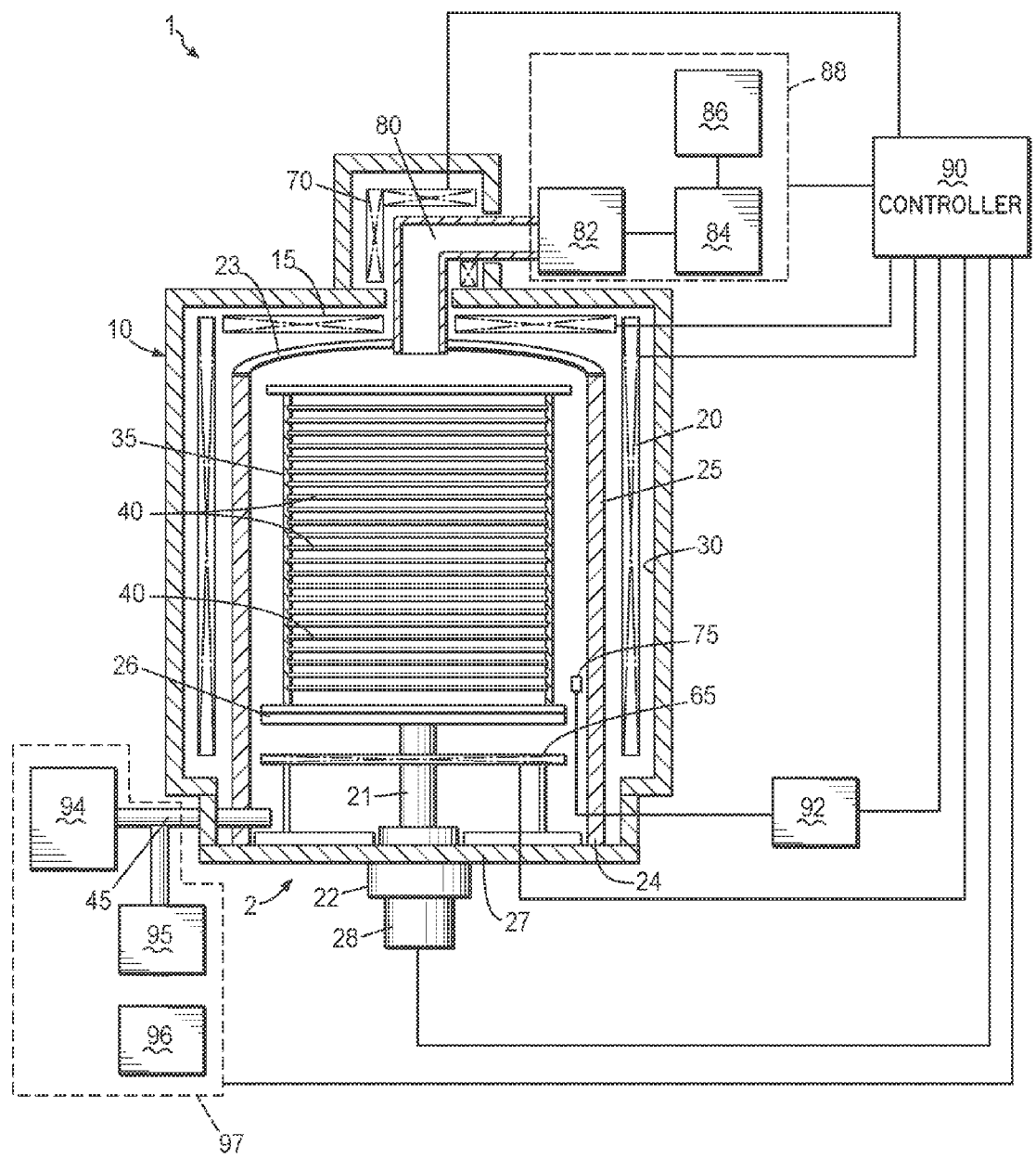
FIG. 1 shows a simplified block diagram of a batch processing system according to an embodiment of the invention.

Referring now to the drawings, FIG. 1 shows a simplified block diagram of a batch processing system according to an embodiment of the invention. The batch processing system 1 is configured for fast temperature ramping with a large temperature range. The batch processing system 1 contains a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined atmospheric or below atmospheric pressure in the batch processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

A gas delivery system 97 is configured for introducing gases into the process chamber 10. A plurality of gas supply lines can be arranged around the manifold 2 to supply a plurality of gases into the process tube 25 through the gas supply lines. In FIG. 1, only one gas supply line 45 among the plurality of gas supply lines is shown. The gas supply line 45 shown, is connected to a first gas source 94. In general, the first gas source 94 can supply gases for processing the substrates 40, including $N_2$ and $NH_3$ gases for pre-treating the substrates 40 prior to AlN deposition, trimethylaluminum (TMA) and $NH_3$ for forming AlN films in a Molecular Layer Deposition (MLD) process, and nitrogen and oxygen-containing gases (e.g., NO, $N_2O$, and $NO_2$) for post-treating the AlN films. In one example, TMA may be provided by bubbling an inert carrier gas such as $N_2$ through a precursor source containing TMA. Furthermore, $N_2$ gas may be used for further post-treating the films.

In addition, or in the alternate, one or more of the gases can be supplied from the (remote) plasma source 95 that is operatively coupled to a second gas source 96 and to the process chamber 10 by the gas supply line 45. The plasma-excited gas is introduced into the process tube 25 by the gas supply line 45. The plasma source 95 can, for example, be a microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one example, the remote plasma source can be a Downstream Plasma Source Type AX7610, manufactured by MKS Instruments, Wilmington, Mass., USA.

A cylindrical heat reflector 30 is disposed so as to cover the process tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) can be formed in the wall of the process chamber 10 as a cooling medium passage. The heaters 20, 65, and 15 can, for example, maintain the temperature of the substrates 40 between about 20° C. and about 1050° C. The temperature of the substrates can be raised from room temperature to 800° C. at a rate of 100° C./minute, from 800° C. to 900° C. at 50° C./minute, and from 900° C. to 1050° C. at 25° C./minute.

The vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas delivery system 97 and the process pressure can be adjusted by the APC 82. The trap 84 can collect unreacted precursor material and by-products from the process chamber 10.

The process monitoring system 92 comprises a sensor 75 capable of real-time process monitoring and can, for example, include a mass spectrometer (MS), a FTIR spectrometer, or a particle counter. A controller 90 includes a microprocessor, a memory, and a digital I/O port capable of generating control voltages sufficient to communicate and activate inputs to the batch processing system 1 as well as monitor outputs from the batch processing system 1. Moreover, the controller 90 is coupled to and can exchange information with gas delivery system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the batch processing system 1, or it may be remotely located relative to the batch processing system 1 via an internet or intranet. Thus, the controller 90 can exchange data with the batch processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

It is to be understood that the batch processing system 1 depicted in FIG. 1 is shown for exemplary purposes only, as many variations of the specific hardware can be used to practice the present invention, and these variations will be readily apparent to one having ordinary skill in the art. The batch processing system 1 in FIG. 1 can, for example, process substrates of any size, such as 200 mm substrates, 300 mm substrates, or even larger substrates. Furthermore, the batch processing system 1 can simultaneously process up to about 100 substrates, or more. Alternately, the batch processing system 1 can simultaneously process up to about 25 substrates.

Figure 2:
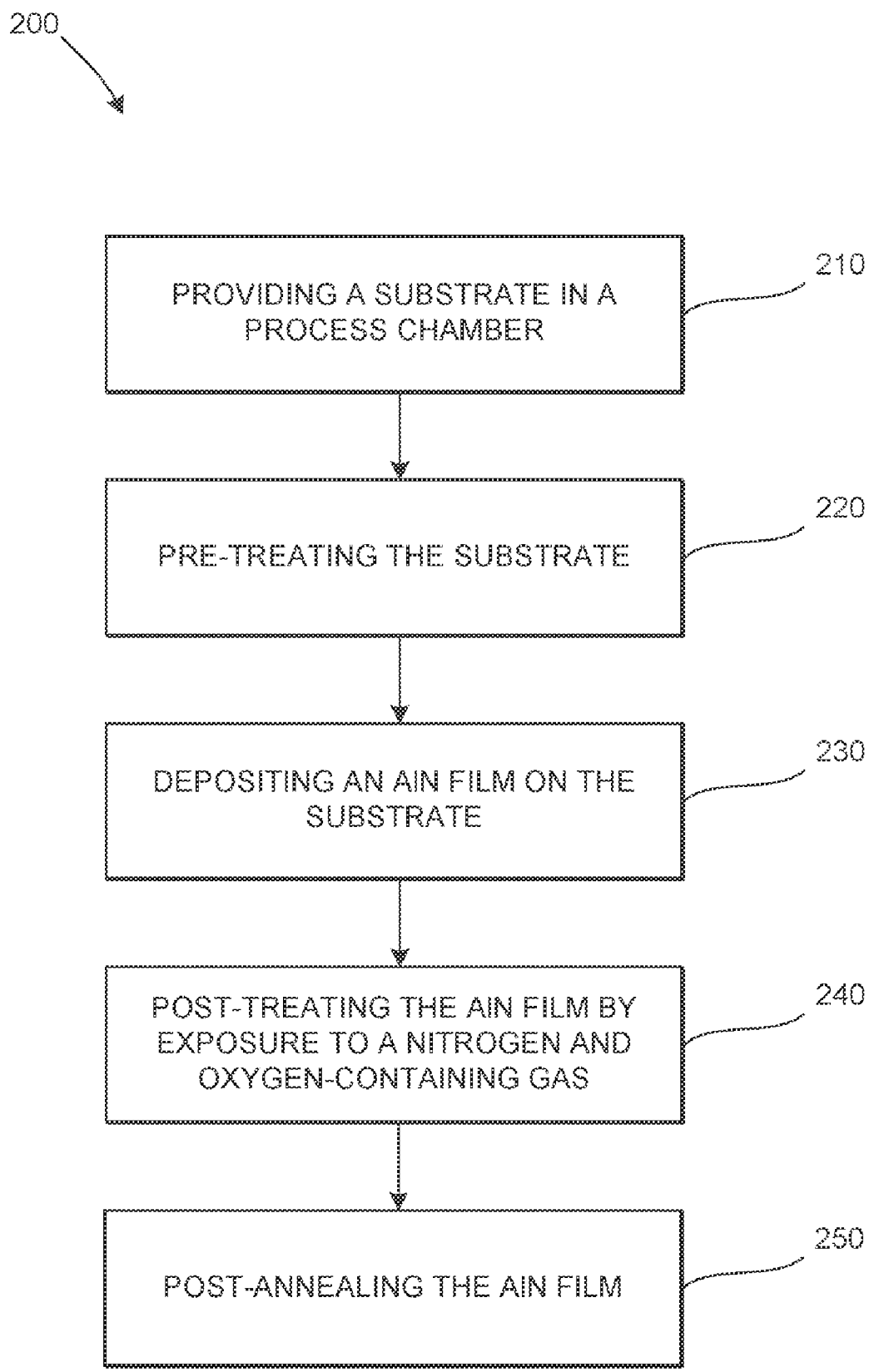
FIG. 2 illustrates a flow diagram for pre-treating a substrate, forming an AlN film on the pre-treated substrate, post-treating the AlN film, and post-annealing the post-treated AlN film according to an embodiment of the invention.
Figure 3:
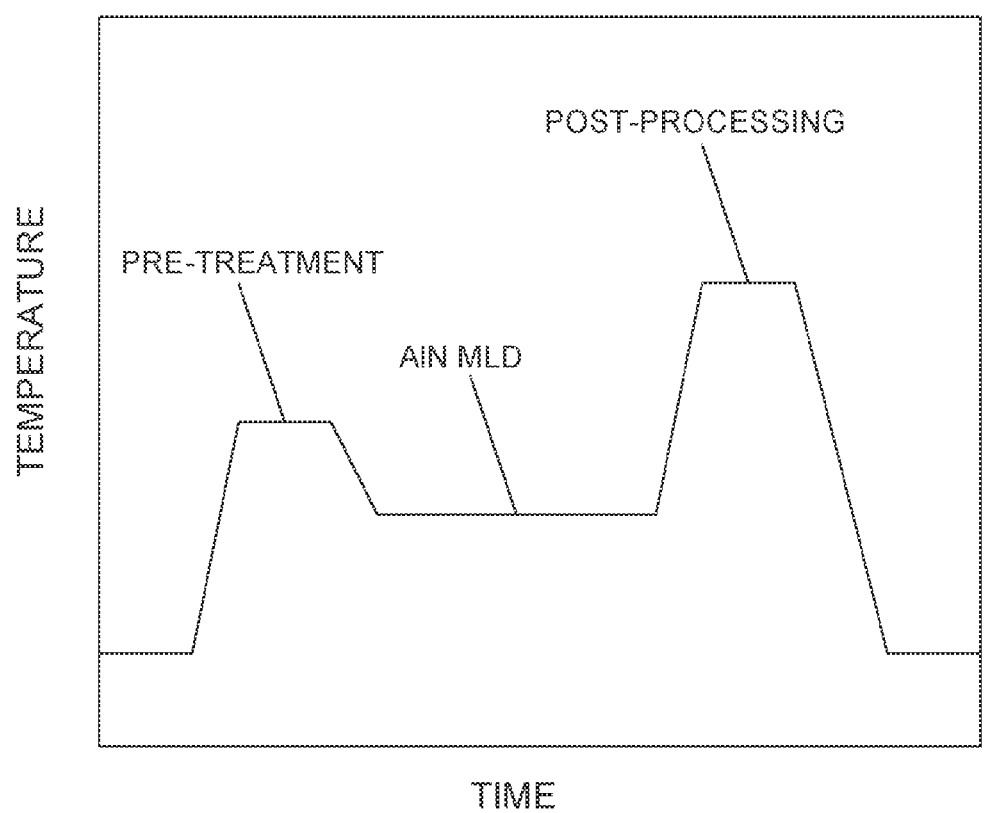
FIG. 3 illustrates the variation in substrate temperature as a function of processing time for pre-treating a substrate, forming an AlN film on the pre-treated substrate, and post-processing the AlN film according to an embodiment of the invention.

Reference will now be made to FIGS. 2 and 3. FIG. 2 illustrates a flow diagram for pre-treating a substrate, forming an AlN film on the pre-treated substrate, and post-treating the AlN film, and post-annealing the post-treated the AlN film according to an embodiment of the invention. FIG. 3 illustrates the variation in substrate temperature as a function of processing time for pre-treating a substrate, forming an AlN film on the pre-treated substrate, and post-processing the AlN film according to an embodiment of the invention. In FIG. 3, post-processing includes post-treating the AlN film with a nitrogen and oxygen-containing gas to oxidize the film, and optionally post-annealing the AlN film before or after the post-treating.

Embodiments of the invention provide a method for in-situ formation of oxidized AlN films. In-situ processing allows for sequentially performing pre-treating, depositing, post-treating, and post-annealing steps in a single processing system. In-situ processing reduces substrate loading periods, temperature ramp periods, substrate unloading periods, and substrate transport periods. Furthermore, in-situ processing reduces contamination of various films and film interfaces during processing and eliminates exposure of undensified high-k films to air.

In FIG. 2, in step 210 of the process 200, a substrate is provided in a process chamber. The process chamber can, for example, be the process chamber 10 of the batch processing system 1 depicted in FIG. 1. Alternatively, the processing system can be a single wafer processing system. The substrate may be cleaned by conventional wet cleaning methods prior to being introduced into the process chamber. For example, the substrate may be cleaned using $H_2SO_4:H_2O_2$ (10:1), $H_2O$: HF (15:1) (for native oxide removal), $NH_4OH:H_2O_2:H_2O$ (0.5:1:5), or $HCl:H_2O_2:H_2O$ (0.6:1:5) solutions.

In 220, the substrate is pre-treated by exposure to $NH_3$ gas in the process chamber. The pre-treating may be performed at the same or lower substrate temperature than the subsequent AlN film deposition or, alternatively, as depicted in FIG. 3, the pre-treating may be performed at a higher substrate temperature than the subsequent AlN film deposition. For example, the pre-treating may be performed at a substrate temperature between 400° C. and 700° C., or at a substrate temperature between 450° C. and 650° C. Alternately, the pre-treating step 220 may be omitted from the process 200. Elemental depth analysis of the subsequently deposited AlN film showed that the $NH_3$ pre-treatment resulted in nitrogen buildup at the interface of the AlN film and the underlying Si substrate. However, no separate interface layer was observed in TEM between the AlN layer and the underlying Si substrate.

In 230, an AlN film is deposited onto the substrate. The AlN film may be deposited using a MLD process employing alternating exposure cycles of $NH_3$ and TMA at a substrate temperature between 300° C. and 450° C. with a purge/evacuation period between each exposure of $NH_3$ and TMA. Linear AlN film growth was observed, with deposition rates of about 2.4 angstrom/cycle at 350° C. and about 3.1 angstrom/cycle at 400° C. In accordance with various embodiment of the invention, the thickness of the AlN film may be between 5 and 100 angstroms, for example, between 10 and 50 angstroms.

In 240, the AlN film is post-treated by exposure to a nitrogen and oxygen-containing gas. The nitrogen and oxygen-containing gas can contain NO, $N_2O$, or $NO_2$, or a combination of two or more thereof. The nitrogen and oxygen-containing gas may further contain an inert gas, for example Ar. The post-treating step 240 incorporates oxygen into the AlN film to form an oxidized AlN film. Little to no increase in the thickness of the AlN film results from the post-treatment, for example, the thickness increase may be less than 5 angstroms. In accordance with one embodiment, the post-treatment exposure may be at a substrate temperature of greater than 500° C., for example, between 500° C. and 850° C.

In 250, the post-treated (oxidized) AlN film may be post-annealed by exposure to $N_2$ gas at a substrate temperature between 200° C. and 800° C., or at a substrate temperature between 500° C. and 700° C. Alternately, the post-annealing step 250 may be omitted.

According to another embodiment of the invention, the AlN film may be post-annealed by exposure to $N_2$ gas prior to post-treating the film by exposing it to a nitrogen and oxygen-containing gas. In other words, step 250 in FIG. 2 may be performed before step 240.

Figure 4:
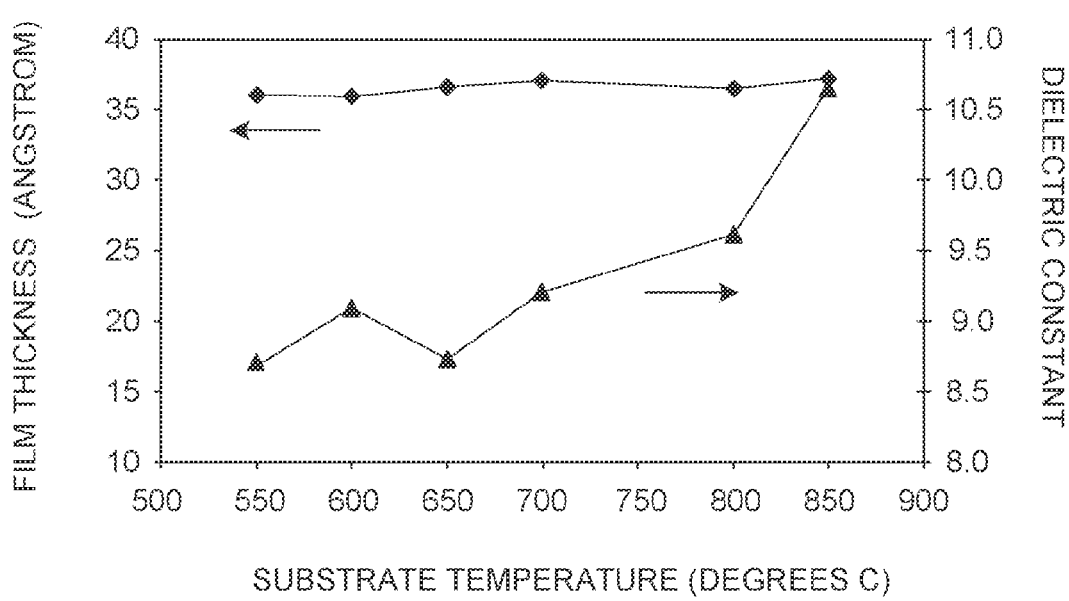
FIG. 4 shows thickness of oxidized AlN films and film dielectric constant as a function of substrate temperature for a nitric oxide post-treatment according to an embodiment of the invention.

FIG. 4 shows thickness of oxidized AlN films and film dielectric constant as a function of substrate temperature for a nitric oxide post-treatment according to an embodiment of the invention. The post-treated AlN films were further post-annealed in $N_2$ at 800° C. FIG. 4 shows that increasing the substrate temperature from 550° C. to 850° C. for the oxidizing post-treatment increases the overall dielectric constant while the AlN film thickness is substantially not changed. The dielectric constant increases from about 8.7 for a nitric oxide post-treatment at a substrate temperature of 550° C. to about 10.7 at a substrate temperature of 850° C.

According to one embodiment of the invention, an AlN film having a thickness between 10 and 30 angstrom may be deposited on a substrate by alternately exposing the substrate to $NH_3$ and TMA at a substrate temperature between 350° C. and 450° C., and the AlN film post-treated by exposure to NO gas at a substrate temperature between 550° C. and 650° C.

According to another embodiment of the invention, an AlN film having a thickness between 30 and 50 angstrom may be deposited on a substrate by alternately exposing the substrate to $NH_3$ and TMA at a substrate temperature between 300° C. and 400° C., and the AlN film post-treated by exposure to NO gas at a substrate temperature between 750° C. and 850° C.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the scope of applicants' general inventive concept.

What is claimed is:

1. A method for processing a silicon-containing substrate, comprising:
    providing the silicon-containing substrate in a process chamber;
    pre-treating the silicon-containing substrate by exposing the silicon-containing substrate to $NH_3$;
    depositing an AlN film on the pre-treated silicon-containing substrate; and
    post-treating the AlN film with exposure to a nitrogen and oxygen-containing gas, wherein the post-treating increases the dielectric constant of the AlN film.

2. The method of claim 1, wherein the depositing comprises:
    depositing an AlN film in a MLD process.

3. The method of claim 1, wherein the depositing comprises:
    depositing an AlN film in a MLD process at a substrate temperature between 300° C. and 450° C.

4. The method of claim 3, wherein the depositing comprises:
    alternately exposing the substrate to $NH_3$ and TMA.

5. The method of claim 1, wherein the post-treating comprises exposing the AlN film to NO, $N_2O$, or $NO_2$, or a combination thereof.

6. The method of claim 1, wherein the post-treating comprises exposing the AlN film to a nitrogen and oxygen-containing gas at a substrate temperature greater than 500° C.

7. The method of claim 1, wherein the post-treating comprises exposing the AlN film to a nitrogen and oxygen-containing gas at a substrate temperature between 500° C. and 850° C.

8. The method of claim 1, wherein the post-treating increases the thickness of the AlN film by less than 5 angstrom.

9. The method of claim 1, further comprising:
    post-annealing the AlN film by exposure to $N_2$, wherein the post-annealing is performed before or after the post-treating.

10. The method of claim 1, wherein a thickness of the AlN film is between 10 and 50 angstrom.

11. The method of claim 1, wherein a thickness of the AlN film is between 5 and 100 angstrom.

12. A method for processing a silicon-containing substrate, comprising:
    providing the silicon-containing substrate in a process chamber;
    pre-treating the silicon-containing substrate by exposing the silicon-containing substrate to $NH_3$;
    depositing an AlN film on the pre-treated silicon-containing substrate by alternately exposing the substrate to $NH_3$ and TMA at a substrate temperature between 350° C. and 450° C., wherein the AlN film has a thickness between 10 and 30 angstrom; and
    post-treating the AlN film with exposure to NO gas at a substrate temperature between 550° C. and 650° C.

13. The method of claim 12, further comprising:
    post-annealing the AlN film by exposure to $N_2$, wherein the post-annealing is performed before or after the post-treating.

14. The method of claim 12, wherein the post-treating increases the thickness of the AlN film by less than 5 angstrom.

15. A method for processing a silicon-containing substrate, comprising:
    providing the silicon-containing substrate in a process chamber;
    pre-treating the silicon-containing substrate by exposing the silicon-containing substrate to $NH_3$;
    depositing an AlN film on the pre-treated silicon-containing substrate by alternately exposing the substrate to $NH_3$ and TMA at a substrate temperature between 300° C. and 400° C., wherein the AlN film has a thickness between 30 and 50 angstrom; and
    post-treating the AlN film with exposure to NO gas at a substrate temperature between 750° C. and 850° C.

16. The method of claim 15, further comprising:
    post-annealing the AlN film by exposure to $N_2$, wherein the post-annealing is performed before or after the post-treating.

17. The method of claim 15, wherein the post-treating increases the thickness of the AlN film by less than 5 angstrom.

* * * * *

UNITED STATES PATENT AND TRADEMARK OFFICE
CERTIFICATE OF CORRECTION

PATENT NO. : 7,776,763 B2
APPLICATION NO. : 11/745278
DATED : August 17, 2010
INVENTOR(S) : Kimberly G. Reid et al.

It is certified that error appears in the above-identified patent and that said Letters Patent is hereby corrected as shown below:

Col. 1, line 24, "referred to Molecular Layer" should read --referred to as Molecular Layer--.

Col. 1, line 51, "complimentary" should read --complementary--.

Col. 2, line 14, "50 angstrom (A)." should read --50 angstrom (Å).--.

Col. 4, line 62, "or memory for holding" should read --or memory may hold--.

Col. 4, line 64, "invention and for containing" should read --invention and may contain--.

Col. 5, line 33, "the post-treated the AIN" should read --the post-treated AIN--.

Signed and Sealed this

Twenty-sixth Day of October, 2010

David J. Kappos
*Director of the United States Patent and Trademark Office*